(12) United States Patent
Kerek et al.

(10) Patent No.: US 9,948,245 B2
(45) Date of Patent: Apr. 17, 2018

(54) AMPLIFYING STAGE WORKING POINT DETERMINATION

(71) Applicant: Deltanode Solutions AB, Stockholm (SE)

(72) Inventors: Daniel Kerek, Danderyd (SE); Peter Lidberg, Strängnäs (SE)

(73) Assignee: DELTANODE SOLUTIONS AKTIEBOLAG, Stockholm (SE)

( * ) Notice: Subject to any disclaimer, the term of this patent is extended or adjusted under 35 U.S.C. 154(b) by 0 days.

(21) Appl. No.: 14/915,250

(22) PCT Filed: Aug. 27, 2014

(86) PCT No.: PCT/SE2014/050985
§ 371 (c)(1),
(2) Date: Feb. 29, 2016

(87) PCT Pub. No.: WO2015/030663
PCT Pub. Date: Mar. 5, 2015

(65) Prior Publication Data
US 2016/0211810 A1 Jul. 21, 2016

(30) Foreign Application Priority Data
Aug. 28, 2013 (SE) .................. 1350989

(51) Int. Cl.
*H03F 3/68* (2006.01)
*H03F 1/32* (2006.01)
(Continued)

(52) U.S. Cl.
CPC ......... *H03F 1/3282* (2013.01); *H03F 1/0288* (2013.01); *H03F 1/3247* (2013.01);
(Continued)

(58) Field of Classification Search
CPC ....................................... H03F 3/68
(Continued)

(56) References Cited

U.S. PATENT DOCUMENTS 7,619,468 B1 * 11/2009 Bowles ............... H03F 1/0266
330/124 R
8,706,062 B1 * 4/2014 Yu ..................... H03F 1/3223
455/126
(Continued)

FOREIGN PATENT DOCUMENTS

| EP | 1959564 A2 | 8/2008 |
| EP | 2230759 A1 | 9/2010 |
| WO | 03050947 A1 | 6/2003 |

OTHER PUBLICATIONS

International Preliminary Report on Patentability, dated Mar. 1, 2016, for PCT/SE2014/050985 filed Aug. 27, 2014, 6 pages.
(Continued)

*Primary Examiner* — Patricia T Nguyen
(74) *Attorney, Agent, or Firm* — Wegman, Hessler & Vanderburg (57) ABSTRACT

An amplifier circuit including an amplifying stage and a predistortion stage is disclosed. The amplifier circuit outputs an output signal $X_o$. The predistortion stage is arranged for providing a predistortion signal $X_p$ to be added to an input signal $X_{in}$ of the amplifier circuit in order to compensate for non-linearites of said amplifying stage. According to the present invention, the amplifier circuit includes a working point unit arranged for determining a suitable working point $WP_{suitable}$ to be used for said amplifying stage based on said predistortion signal $X_p$, and for adjusting an actual working point $WP_{actual}$ being used by said amplifying stage towards said suitable working point $WP_{suitable}$.

17 Claims, 5 Drawing Sheets

(51) Int. Cl.
*H03F 1/02* (2006.01)
*H03F 3/193* (2006.01)
*H03F 3/21* (2006.01)

(52) U.S. Cl.
CPC ............. *H03F 3/193* (2013.01); *H03F 3/211* (2013.01); *H03F 2200/451* (2013.01); *H03F 2201/3233* (2013.01); *H03F 2203/21131* (2013.01)

(58) Field of Classification Search
USPC .............................. 330/295, 124 R, 284, 107
See application file for complete search history.

(56) References Cited

U.S. PATENT DOCUMENTS

| | | | | |
|---|---|---|---|---|
| 9,438,186 | B2* | 9/2016 | Srinidhi Embar | H03F 3/21 |
| 2005/0258898 | A1* | 11/2005 | Hongo | H03F 1/3241 |
| | | | | 330/149 |
| 2006/0240786 | A1* | 10/2006 | Liu | H03F 1/3247 |
| | | | | 455/114.3 |
| 2008/0187035 | A1* | 8/2008 | Nakamura | H03F 1/0288 |
| | | | | 375/232 |
| 2012/0025916 | A1 | 2/2012 | Deguchi | |
| 2012/0155572 | A1* | 6/2012 | Kim | H03F 1/3247 |
| | | | | 375/297 |
| 2012/0219048 | A1 | 8/2012 | Camuffo | |
| 2014/0118063 | A1* | 5/2014 | Briffa | H03F 1/32 |
| | | | | 330/124 R |

OTHER PUBLICATIONS

International Search Report and Written Opinion, dated Dec. 9, 2014, for PCT/SE2014/050985 filed Aug. 27, 2014, 9 pgs.

Swedish Office Action, dated Mar. 7, 2013, for SE1350989-8, 8 pages.

Cabral, Pedro Miguel, A Unified Theory for Nonlinear Distortion Characteristics in Different Amplifier Technologies, Microwave Journal, vol. 48, No. 4, Apr. 2005, s.62-78, ISSN 01926225, 6 pages, 2005 Horizon House Publications, Inc.

* cited by examiner

AMPLIFYING STAGE WORKING POINT DETERMINATION

CROSS-REFERENCE TO RELATED APPLICATIONS

This application is the US National phase entry of International Patent Application No. PCT/SE2014/050985 filed Aug. 27, 2014, which claims priority to Swedish Patent Application No. 1350989-8 entitled "Amplifying Stage Working Point Determination" filed on Aug. 28, 2013, all of the above listed applications are incorporated by reference herein.

FIELD OF THE INVENTION

The present invention relates to an amplifier circuit. The present invention also relates to a method for an amplifier circuit. The present invention also relates to a computer program and to a computer program product.

RELATED ART AND BACKGROUND OF THE INVENTION

There is a very large, and still rapidly growing, demand for wireless communication services today. Mobile telephone services are used to a very large extent, e.g. for telephone conversations and text messages. Also, high speed wireless communication is used for a large number of applications, such as internet browsing, streaming of music, films and/or television, and the like.

Since the demand for wireless communication services is very high, and the end users expect the wireless services to be available essentially everywhere they go, the wireless communication system coverage must cover very large geographical areas, both indoors and outdoors, and also provide high bitrates in these areas. Traditionally, radio base stations, such as Base Transceiver Stations (BTS) and eNodeBs, typically being located close to a tower comprising one or more tower-mounted antennas, are provided with all the circuitry necessary for sending and receiving the wireless communication signals to and from the mobile equipments connecting to it, such as Mobile Stations (MS) or User Equipments (UEs). The radio base stations have typically been arranged in cells. The radio base stations include both the circuitry to receive and transmit signals from and to a core network and to receive and transmit signals from and to the one or more antennas, including radio frequency (RF) circuits and power amplifiers. The mobile equipment also include the circuitry for receiving and transmitting signals from and to the radio base stations, including radio frequency (RF) circuits and power amplifiers.

Also, the end users nowadays expect high speed wireless communication services, such as mobile telecommunication services, wireless fidelity networks (WiFi), and Wireless Local Area Networks (WLANs), to be available essentially everywhere. Therefore, a large number of different types of radio transmitting units are distributed in indoor and outdoor locations, such as in malls, railway tunnels, road tunnels, restaurants, cafés, airports, conference centers, tunnels, stadiums and exhibition halls.

Distributed systems have been developed for providing coverage and high bitrates in locations for which the traditional radio base station concept results in poor service coverage and bitrates. One example of such a distributed system is a Distributed Antenna System (DAS). In a DAS one or more Remote Units (RUs), each possibly being utilized by one operator/service provider and providing one system and/or service, are connected to one or more Remote Unit Controllers (RUCs) and/or one or more fiber cables. Typically, the one or more RUCs are radio base stations, such as a BTS or an eNodeB or the like. These radio base stations provide RF signals related to one or more services and/or service providers to the RUs via fiber cables. The RUs transmit/receive the RF signals to/from the mobile equipment.

Also, smaller cells have been developed, such as pico cells and femto cells, which can be used for increasing coverage and bitrates, and to lower the costs. The micro base stations and pico base stations are complete standalone radio base stations, including all the circuitry of the traditional radio base stations, including all the circuitry necessary for sending and receiving the wireless communication signals to and from the mobile equipment, including power amplifiers. The pico cells and femto cells can be deployed such that coverage and bitrates can be optimized for the geographical area of the communication system, both outdoors and indoors.

A further development of the smaller cell concept is the Remote Radio Head (RRH) concept. The RRH concept breaks up the traditional radio base station architecture into a possibly centrally located processing facility, a so called RRH controller, and one or more distributed antennas units, in this document called RRH units, being connected to the processing facility through a network preferably having a high bandwidth. Here, all the traditional radio base station processing equipment except for the radio frequency processing equipment and the power amplification equipment are located in the RRH controller, whereas the radio frequency processing equipment and power amplification equipment are located in the distributed RRH units.

As has been described above, there are today a number of concepts available for providing and extending the coverage of mobile services and for enhancing the bitrates at certain locations in the systems. There are also a number of other such concepts available for extending the coverage and/or enhancing the bitrates. In all of these concepts, a radio signal is transmitted between a radio base station/RU/RRH and a mobile equipment of some kind over an air interface. This transmission over the air interface requires for all of these concepts for an amplification of the signals to be transmitted. This amplification is typically performed by utilization of one or more power amplifiers.

Power amplifiers are often utilized as the last amplifier in a transmission chain, i.e. at the output of the transmission chain. The power amplifiers are thus responsible for providing an RF output signal having a sufficient signal power to an antenna arrangement. Generally, the signal power should be high enough to provide a predetermined transmission coverage and/or error rate for the radio transmission. However, the signal power, and also other features of the transmitted signals, must be kept within predetermined limits, in order to reduce interference in the radio transmission system into which the radio signal is transmitted.

There are a number of different classes of amplifiers that are used for power amplification, such as classes A, B, AB, C, D, E, and additional classes, e.g. Doherty amplifiers.

Class A amplifiers utilize the whole input signal for the amplification and the conductive element in the amplifier conducts during the whole amplification cycle time. Class A amplifiers are simple and add relatively little distortion to the signal.

Class B amplifiers only utilize half of the input signal for the amplification and the conductive element in the amplifier conducts during half of the amplification cycle time. Class B amplifiers are power efficient but add a relatively large amount of distortion and/or non-linearity to the signal.

Class AB power amplifiers can be seen as a compromise between class A and class B amplifiers. The class AB amplifier generally operates the same way as the class B amplifier over half the amplification cycle time, but also conducts a small part on the other half of the cycle. Class AB amplifiers thereby sacrifice some power efficiency over class B amplifiers, but gains in linearity. Class AB amplifiers are typically much more power efficient than class A amplifiers.

Class C amplifiers conduct less than half of the input signal and the distortion at the output is high. However, high power efficiencies are possible. A common application for class C amplifiers is in RF transmitting devices operating at a single fixed carrier frequency, where the distortion is controlled by a tuned load of the amplifier. The input signal is used to switch the active device, which causes pulses of current to flow through a tuned circuit being a part of the load. The tuned circuit resonates at one frequency, e.g. at the fixed carrier frequency, which suppresses the unwanted frequencies, and the wanted full signal can be extracted by the tuned load.

A Doherty amplifier is a hybrid configuration including a primary/carrier stage in parallel with an auxiliary/peak stage. The input signal is split in order to drive the two amplifying stages, i.e. the primary/carrier stage and the auxiliary/peak stage. A combining network sums the output signals from the two amplifying stages and phase shifting networks are used at the inputs and outputs of the Doherty amplifier. During periods of low signal level, the primary/carrier stage efficiently operates on the signal and the auxiliary/peak stage is cutoff, whereby the amplifier consumes little power. During periods of high signal level, the primary/carrier stage delivers its maximum power and the auxiliary/peak stage delivers up to its maximum power. The primary/carrier stage can be implemented e.g. by use of a class B amplifier or by a class C amplifier. The auxiliary/peak stage can be implemented e.g. by use of a class C amplifier.

Usage of power amplification in communication systems for amplification of the RF signals, which is necessary in order to provide sufficient coverage and bitrates, has a problem in lack of linearity of the power amplifiers. Non-linearity of the power amplifiers prevents the power amplifiers to accurately reproduce the signal being applied to its input port. Also, non-linear power amplifiers used in a transmitter in a communication system cause the transmitted signal to leak into adjacent frequency radio frequencies/channels, which creates distortion in these adjacent radio frequencies/channels.

The non-linearity of the power amplifiers limits the performance of the whole communication system. Non-linearities in the frequency response of the power amplifiers create distortions that also limit the dynamic range of the amplifiers. Also, the created distortions degrade the overall system performance since the distortions are transmitted over the air interface of the communication system, whereby other signals and/or entities in the communication system can be distorted.

A large number of solutions, e.g. utilizing predistortion, have previously been presented in order to solve these problems. When predistortion is utilized, an inverse model of the assumed amplifier distortion is introduced into the amplifier input. The idea is that the predistortion should cancel out the distortion such that the predistortion and the distortion together result in an amplifier circuit having linear gain and phase. However, such previously known solutions tend to decrease the amplifier efficiency while maintaining a high current consumption. Also, the previously known solutions increase the hardware complexity and cost considerably.

Aim and Most Important Features of the Invention

It is an object of the present invention to provide an amplifier circuit and an amplification method that solves the above stated problem.

Hence, according to a first aspect of the present invention, an amplifier circuit is provided, comprising an amplifying stage and a predistortion stage and being arranged for outputting an output signal $X_0$. The predistortion stage is arranged for providing a predistortion signal $X_p$ to be added to an input signal $X_{in}$ of the amplifier circuit in order to compensate for non-linearites of said amplifying stage. Further, the amplifier circuit comprises a working point unit arranged for determining a suitable working point $WP_{suitable}$ to be used for the amplifying stage based on the predistortion signal $X_p$, and for adjusting an actual working point $WP_{actual}$ being used by the amplifying stage towards the suitable working point $WP_{suitable}$.

According to a second aspect of the present invention, a method for an amplifier circuit is provided, wherein the amplifier circuit includes an amplifying stage and a predistortion stage and outputs an output signal $X_0$. The predistortion stage provides a predistortion signal $X_p$ to be added to an input signal $X_{in}$ of the amplifier circuit in order to compensate for non-linearites of the amplifying stage. The method comprises determining a suitable working point $WP_{suitable}$ to be used for the amplifying stage based on the predistortion signal $X_p$, and adjusting an actual working point $WP_{actual}$ being used by the amplifying stage towards the suitable working point $WP_{suitable}$.

According to a third aspect, there is provided a computer program which when run in a computer causes the computer to execute the method according to the second aspect of the present invention.

According to the present invention a suitable working point $WP_{suitable}$ to be used by an amplifying stage is determined based on a predistortion signal $X_p$ being provided by a predistortion stage. An actual working point $WP_{actual}$ being used by the amplifying stage is then adjusted towards the suitable working point $WP_{suitable}$, which is determined based on the predistortion signal $X_p$.

Hereby, an optimal working condition for the amplifying stage can be automatically found and maintained. This optimal working condition can by the present invention be reached when the amplification efficiency is at its maximum, at the same time as the gain and linearity of the amplifier circuit is preserved.

A reduction of the power consumption and a more linear power amplification can hereby be achieved. The reduced power consumption that can be achieved by the present invention also results in extended component lifetimes due to lowered working temperatures for the amplifier circuit according to the present invention.

Since the suitable working point $WP_{suitable}$ determination is based on the predistortion signal $X_p$, a dynamic working point $WP_{suitable}$ determination is achieved. Thus an adjustment to current transmission and/or signal situation/scenarios is possible by usage of the present invention.

The present invention can be implemented mainly in the software and therefore adds very little to the hardware complexity and/or production costs.

In this document, the present invention is presented mainly for its implementation on class AB amplifiers and on Doherty amplifiers. However, as is clear for a skilled person, the present invention can of course be utilized together with essentially any power amplifier being used for amplifying RF signals.

The adjustment of the actual working point $WP_{actual}$ of the amplifying stage may for example include adjustment of a gate-source voltage, VGS, for the amplifying stage. The amplifying stage may for example comprise one or more transistors (e.g. field-effect transistors) and the adjustment of the actual working point $WP_{actual}$ of the amplifying stage may for example include adjustment of one or more gate-source voltages for the one or more transistors. The adjustment of the actual working point $WP_{actual}$ of the amplifying stage may for example include adjustment of one or more gate-source voltages for the one or more transistors of the amplifying stage, while maintaining one or more drain-source voltages, VDS, for the one or more transistors constant. The amplifying stage may for example include a Doherty configuration amplifier or a class AB amplifier including one or more amplifier chains for which one or more gate-source voltages are adjusted as part of adjusting the actual working point $WP_{actual}$ of the amplifying stage.

DETAILED DESCRIPTION OF PREFERRED EMBODIMENTS

Figure 1:
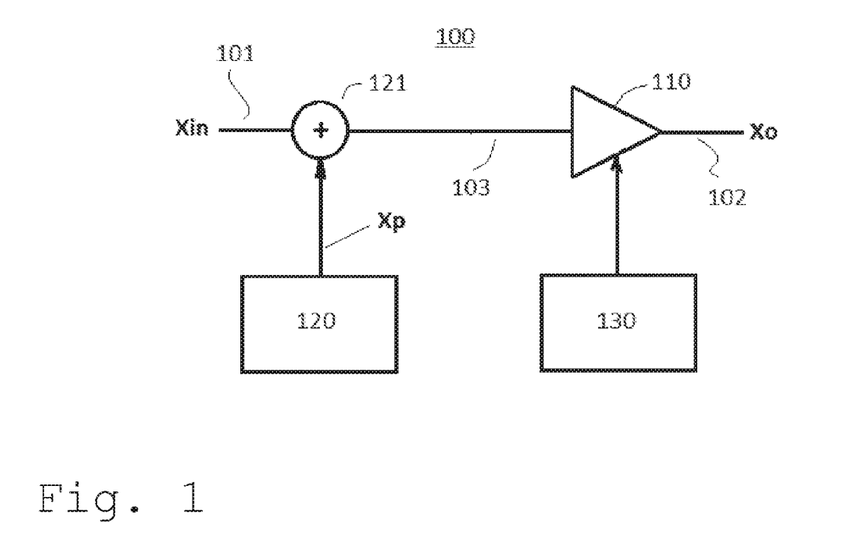
FIG. 1 shows an amplifier circuit according to an embodiment of the present invention.

FIG. 1 schematically shows an amplifier circuit 100 according to the present invention. The amplifier circuit 100 amplifies an input signal $X_{in}$ being applied on an input 101 of the amplifier circuit 100. The amplifier circuit 100 includes an amplifying stage 110 and a predistortion stage 120. The predistortion stage 120 is arranged for providing a predistortion signal $X_p$, which is added to the input signal $X_{in}$ in a combiner 121. By adding the predistortion signal $X_p$ to the input signal $X_{in}$, a compensation for non-linearities later being added by the amplifying stage 110 is provided. Thus, the signal being outputted at the combiner output 103 is a combined input and predistortion signal $X_{in}+X_p$. The combined input and predistortion signal $X_{in}+X_p$ is then amplified in the amplifying stage 110. The amplifier circuit 100 further includes an output 102, on which the amplified predistorted output signal $X_O$ is outputted;

According to the present invention, the working point unit 130 is arranged for determining a suitable working point $WP_{suitable}$ to be used by the amplifying stage 110. The working point unit 130 is arranged to base the determination of this suitable working point $WP_{suitable}$ on the predistortion signal $X_p$ being provided by the predistortion stage 120. The working point unit 130 is further arranged for adjusting an actual working point $WP_{actual}$ being used by the amplifying stage 110 towards the suitable working point $WP_{suitable}$ determined based on the predistortion signal $X_p$.

Hereby, an optimal working condition for the amplifying stage 110 can be automatically found and maintained. By driving the amplifying stage 110 at an optimal working condition, a reduced power consumption and a more linear power amplification is achieved.

Also since the suitable working point $WP_{suitable}$ determination is based on the predistortion signal $X_p$, a dynamic working point $WP_{suitable}$ determination is achieved, which adjusts to the current transmission and/or signal situation/scenario. Thus, a dynamic and automatic adjustment of the working point $WP_{suitable}$, e.g. based on a number of carriers currently used, a currently used power level, or a current number of users within a carrier, can be achieved by the amplifier circuit according to the present invention.

Also, an extended component lifetime can be achieved by use of the amplifier circuit according to the present invention. This is due to the fact that the lower power consumption of the amplifier circuit 100 of the present invention results in a lower working temperature for the present amplifier circuit 100. Lower working temperatures reduce the risk for component failure in electrical circuitry in general, and for amplifier circuits in particular.

Implementation of the present invention in a transmission unit, for example in a Multi Carrier Power Amplifier (MCPA) being designed to amplify at least two radio signals at different carrier frequencies, can be done with very little addition to the hardware and/or production costs, since the hardware needed for implementation of the present invention is already present in predistortion amplifiers of today. Thus, the present invention can be implemented in the software, without additional hardware. Therefore, the additional cost for implementing the present invention is very small.

Figure 2:
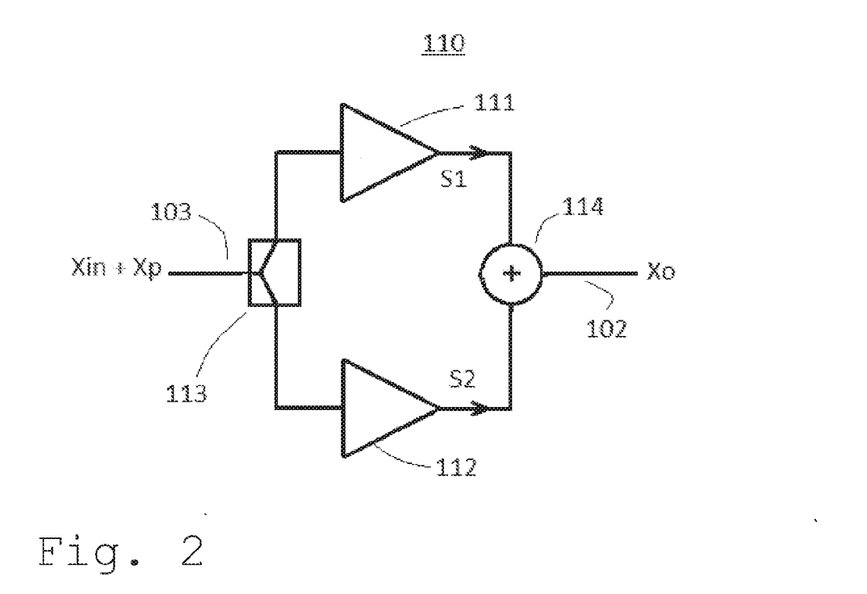
FIG. 2 shows an amplifier circuit according to an embodiment of the present invention.

FIG. 2 schematically shows an amplifying stage 110 of an amplifier circuit 100 according to an embodiment of the present invention. Here, the amplifying stage 110 includes a first 111 amplifier chain and a second 112 amplifier chain, the first 111 and second 112 amplifier chains being arranged parallel to each other. The combined input and predistortion signal $X_{in}+X_p$ on the amplifying stage input 103 is provided to a splitter 113, which splits the combined input and predistortion signal $X_{in}+X_p$ to the first 111 and second 112 amplifier chains.

The amplifying stage 110 shown in FIG. 2 illustrates a general class AB amplifier. Class AB amplifiers can be arranged in a number of different configurations, such as a single amplifier chain configuration, a configuration having two or more parallel amplifier chains, a push-pull configuration, or a configuration combining one or more of these configurations. The one or more amplifier chains in these configurations are all arranged for handling essentially the same signal power levels.

For class AB amplifiers, the suitable working point $WP_{suitable}$, which is determined and adjusted towards according to the present invention, is the amplifier bias voltages defining a sweet point for the amplifier chains of the class AB amplifier. This is described more in detail below.

An amplifier circuit according to the invention including an amplifying stage 110 as shown in FIG. 2 has corresponding advantages as the amplifier circuit shown in FIG. 1 above. Thus, an optimal working condition for the amplifying stage 110 can be automatically and efficiently determined, and can also be maintained for changing transmission and/or signal conditions. Hereby, a reduced power consumption, a more linear power amplification, and an extended component lifetime are achieved at a very moderate additional cost by the amplifier circuit according to the invention.

Figure 3:
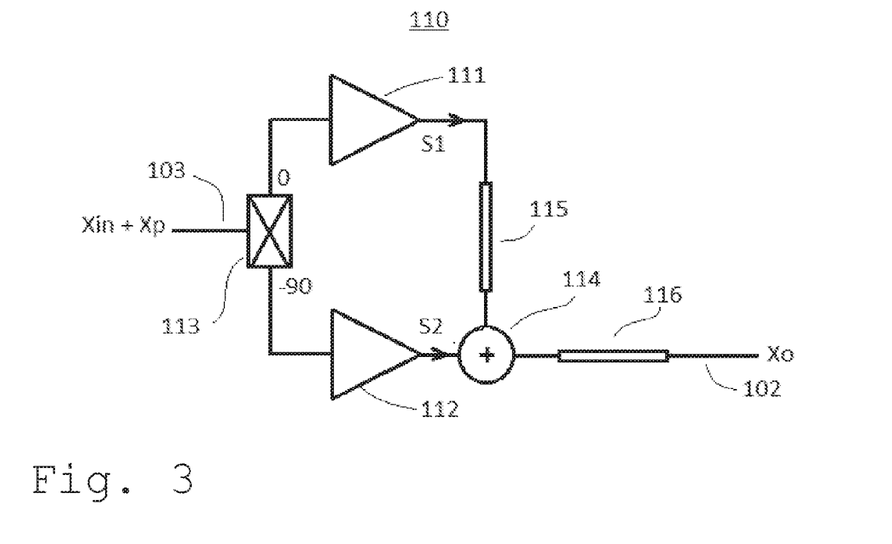
FIG. 3 shows an amplifier circuit according to an embodiment of the present invention.

FIG. 3 schematically shows an amplifying stage of an amplifier circuit 100 according to an embodiment of the present invention. The amplifying stage 110 is here a Doherty configurated amplifying stage 110. Thus, the amplifier circuit 100 according to this embodiment of the present invention includes a Doherty configuration amplifying stage 110.

The Doherty amplifying stage 110 includes a first 111 amplifier chain and a second 112 amplifier chain, the first 111 and second 112 amplifier chains being arranged parallel to each other. The combined input and predistortion signal $X_{in}+X_p$ on the amplifying stage input 103 is provided to a splitter and 90° phase shifter 113. The splitter/phase shifter 113 splits the combined input and predistortion signal $X_{in}+X_p$ and provides the split parts to the first 111 and second 112 amplifier chains, respectively. The phase of the second part of the combined input and predistortion signal $X_{in}+X_p$, being provided to the second 112 amplifier chain, is shifted/delayed with 90° by the splitter 113.

The first amplifier chain 111 of the amplifying stage 110 is arranged for amplification of higher and lower power signals, and the second amplifier chain 112 is arranged for amplification only of higher power signals. The first signal S1 of the combined input and predistortion signal $X_{in}+X_p$ being amplified by the first amplifier chain 111 is shifted/delayed with 90° by a transmission line 115 having a length corresponding to a 90° phase shift, before it is combined with the second signal S2, being an amplified second part of the combined input and predistortion signal $X_{in}+X_p$, by the combiner 114. The impedance of the combined first S1 and second S2 signals of the signal, i.e. the predistorted and amplified $X_{in}+X_p$ signal, is then transformed by an impedance transformer 116, which for example can perform an impedance transformation from 25Ω, which can be the impedance after the combined 114, to 50Ω, which should be the impedance for the output signal $X_O$ at the output 102.

An amplifier circuit according to the invention including an Doherty configuration amplifying stage 110 as shown in FIG. 3 has the above mentioned advantages, i.e. to be able to provide an efficient determination of an optimal working condition for the amplifying stage 110, which can be adjusted during changing transmission and/or signal conditions, whereby a reduced power consumption, a more linear power amplification, and an extended component lifetime are achieved.

Figure 4:
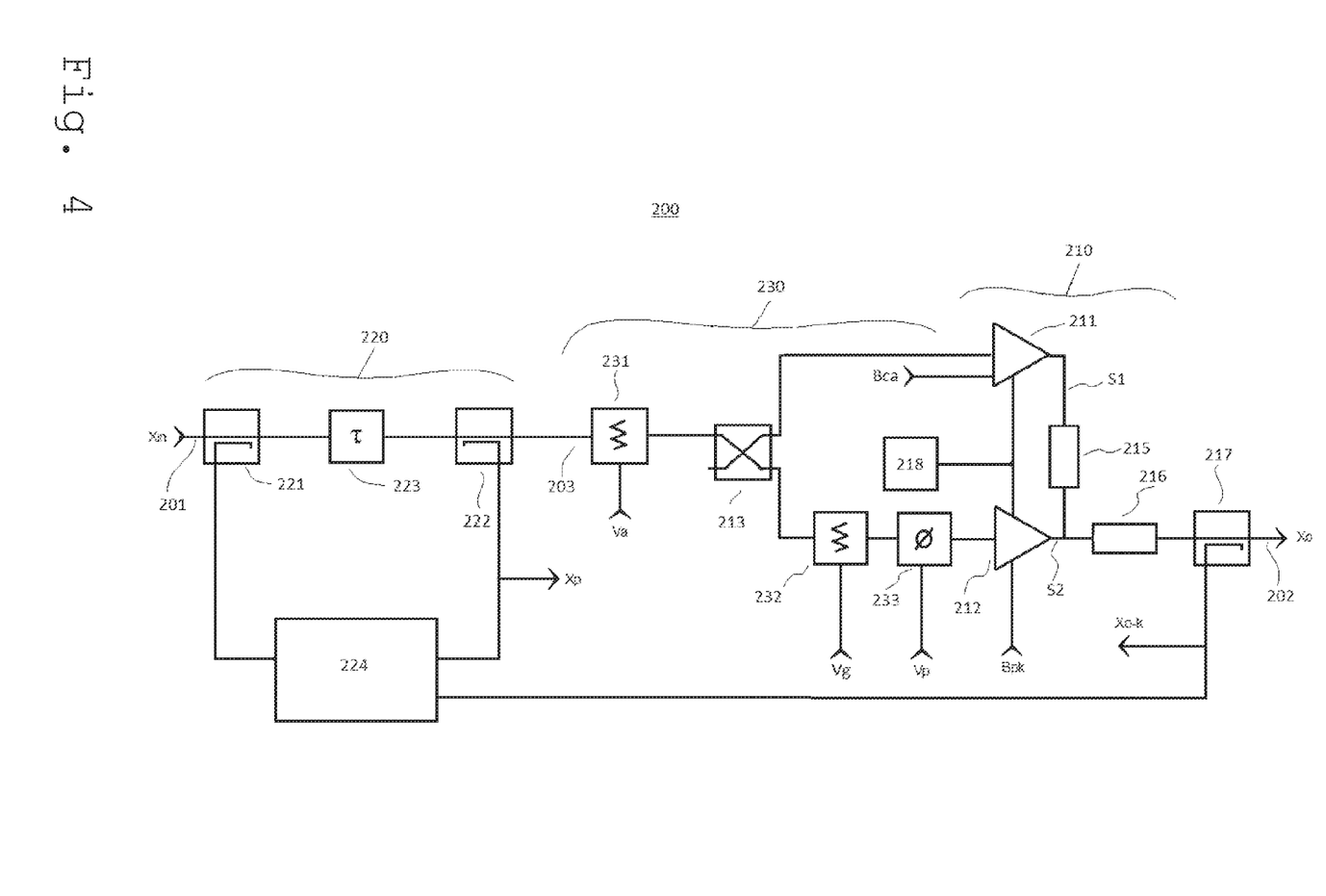
FIG. 4 shows an amplifier circuit according to an embodiment of the present invention.

FIG. 4 shows an amplifier circuit 200 according to an embodiment of the present invention. The amplifier circuit includes an input 201 receiving an input signal $X_{in}$, a predistortion stage 220, a working point stage 230, an amplifying stage 210, and an output 202 providing an output signal $X_O$.

The input signal $X_{in}$ first reaches a first coupler 221, which couples the input signal $X_{in}$ to a predistorter 224. The input $X_{in}$ is then delayed by a delay unit 223. Thereafter a predistorter signal $X_p$ being provided by the predistorter 224 is added to the input signal $X_{in}$ by the second coupler 222. The predistorter 224 determines the predistorter signal $X_p$ based on a comparison of the input signal $X_{in}$ and the output signal $X_O$. For example, the predistorter signal $X_p$ can be determined such that the output signal $X_O$ looks like the input signal $X_{in}$, but amplified. The predistortion stage 220 outputs a predistorted input signal, i.e. a signal being a combined input and predistortion signal $X_{in}+X_p$.

The combined input and predistortion signal $X_{in}+X_p$ is then input to the working point stage 230 and is fed to first attenuation unit 231. The first attenuation unit 231 attenuates the combined input and predistortion signal $X_{in}+X_p$ based on a possible total gain adjustment $V_a$ for the amplifier circuit 100.

The attenuated combined input and predistortion signal $X_{in}+X_p$ is then split up in a splitter and 90° phase shifter 213 splitting the attenuated combined input and predistortion signal $X_{in}+X_p$ and provides the parts to the first 211 and second 212 amplifier chains, respectively. The phase of the second part of the attenuated combined input and predistortion signal $X_{in}+X_p$ being provided to the second 212 amplifier chain is shifted/delayed with 90° by the splitter 213.

In the second amplifier chain 212, the second part of the signal is attenuated in a second attenuator 232 based on an initial peaking amplifier gain $V_g$. The initial peaking amplifier gain $V_g$ is here initially set such that the gain of the first 211 and second 212 amplifier chains, respectively, are essentially equal when the output signal $X_O$ has a maximum power.

From the second attenuator 232, the signal is fed to a phase shifter 233, in which the phase of the signal is shifted based on an initial phase setting of the peaking amplifier $V_p$. The initial phase setting of the peaking amplifier $V_p$ is here initially set such that the first signal S1 being amplified by the first amplifier chain 211 and the second signal S2 being amplified by the second amplifier chain 212 are in phase at the output 202 when the output signal $X_O$ has a maximum power. Thus, by usage of the phase shifter 233, a phase difference $\Delta_{phase}$ between the first 211 and the second 212 amplifier chains is achieved. Also, by usage of the second attenuator 232, an amplitude difference $\Delta_{amplitude}$ between the first 211 and the second 212 amplifier chains is achieved.

Also, bias voltages for the first amplifier chain 211 $B_{ca}$ and for the second 212 amplifier chain $B_{pk}$ are determined by the working point stage 230, and are thereafter used for biasing the first 211 and second 212 amplifier chains. The first amplifier chain bias voltage $B_{ca}$ is initially set for nominal class AB amplifier bias. The second amplifier chain bias voltage $B_{pk}$ is initially set such that the second amplifier chain 112 is cut off for lower power signals and is active for higher power signals.

A current consumption unit 218 is connected to the first 211 and second 212 amplifier chains. The current consumption unit 218 is arranged for determining, e.g. by measuring, the amount of current being used by the amplifiers.

The working point stage/unit 230, which can be implemented in a control unit, is arranged for determining a suitable working point $WP_{suitable}$ and for controlling the second attenuator 232, the phase shifter 233 and the bias voltages $B_{ca}$, $B_{pk}$ for the first 211 and second 212 amplifier chains. The working point stage/unit 230 is arranged for performing this determination of the suitable working point $WP_{suitable}$ based on one or more of a measured level of the predistortion signal $X_p$, a measured level of the output signal $X_O$, and the current consumption.

The amplifier circuit 200 further includes an amplifying stage 210, here being illustrated as a Doherty configured amplifying stage 110.

The Doherty amplifying stage 210 includes the first 211 amplifier chain and the second 212 amplifier chain being arranged in parallel to each other. The first amplifier chain 211 is arranged for amplification of higher and lower power signals, and the second amplifier chain 212 is arranged for amplification only of higher power signals. The first signal S1 being amplified by the first amplifier chain 211 is shifted/delayed with 90° by a transmission line 215 and is combined with the second signal S2 being amplified by the second amplifier chain 212. The combined first S1 and second S2 signals are transformed by an impedance transformer 216, such that the impedance of the output signal $X_O$ at the output 202 is 50Ω.

Figure 6:
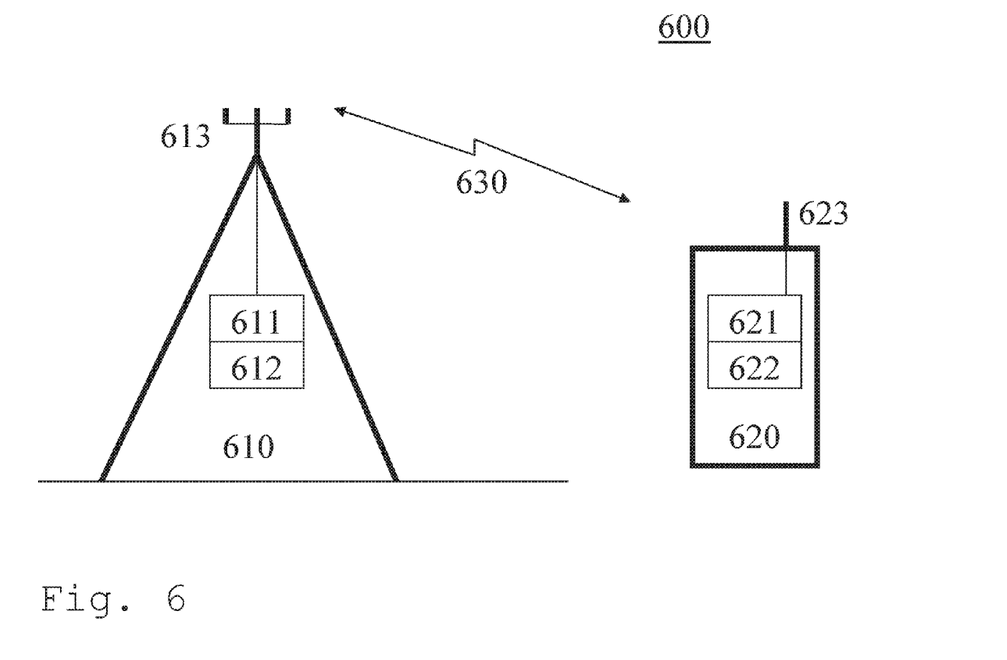
FIG. 6 schematically shows a radio communication system.

As can be seen in the amplifier circuit 200 shown in FIG. 6, the predistortion performed by the predistortion stage 220 is a closed loop predistortion producing the predistortion signal $X_p$, which can be seen as a measure of the linearity of the amplifying stage 210. Thus, the predistortion signal $X_p$ can be seen as an error signal corresponding to the amplifier non-linearity.

The output signal can be written as:

$$X_O = F_{PA}(X_{in} + X_p) = k * X_{in} + \epsilon,$$

where $X_{in}$ is the input signal;
$X_O$ is the output signal;
$X_p$ is the predistortion signal;
$F_{PA}$ is a transfer function for the amplifying stage;
k is the amplification that can be provided by the amplifying stage; and
$\epsilon$ is a residual non-linearity being present on the output signal.

Thus, in a perfect predistortion, the output signal would be $X_o = k * X_{in}$, but since perfect predistortion is almost impossible to perform, there is almost always a residual non-linearity $\epsilon$ left in the output signal that cannot be compensated for by the predistorter. The predistortion signal $X_p$ is preferably chosen such that the residual non-linearity $\epsilon$ is minimized.

By the use of the predistortion signal $X_p$, possibly together with use of a measure of the current consumption provided by the current consumption unit 218, when finding a suitable working point $WP_{suitable}$ in accordance with the present invention, a very efficient and exact determination of the suitable working point $WP_{suitable}$ can be performed.

The above mentioned adjustment of the actual working point $WP_{actual}$, which is provided by the present invention, can include an adjustment of one or more parameters for the amplifying stage 110, 210 including the first 111, 211 and second 112, 212 parallel amplifier chains.

One such parameter can be a phase difference $\Delta_{phase}$ between the first 111, 211 and second 112, 212 amplifier chains. When this parameter is adjusted, the phase shifts being provided to one or more of the first 111, 211 and second 112, 212 amplifier chains are adjusted, such that the phase difference $\Delta_{phase}$ between the first 111, 211 and second 112, 212 amplifier chains is altered.

One such parameter can be an amplitude difference $\Delta_{amplitude}$ between the first 111, 211 and second 112, 212 amplifier chains. When this parameter is adjusted, an attenuation and/or a signal amplification being provided by one or more of the first 111, 211 and second 112, 212 amplifier chains are adjusted, such that the amplitude difference $\Delta_{amplitude}$ between the first 111, 211 and second 112, 212 amplifier chains is altered.

Such parameters can also be a bias voltage for the first 111, 211 amplifier chain and/or for the second 112, 212 amplifier chain. Thus, the bias voltages being used for biasing the amplifiers in the first and/or second amplifier chain, respectively.

The working point unit 130, 230 is, according to an embodiment of the present invention, arranged for determining the suitable working point $WP_{suitable}$, i.e. one of more of a phase difference $\Delta_{phase}$ between the first 111, 211 and second 112, 212 amplifier chains, an amplitude difference $\Delta_{amplitude}$ between the first 111, 211 and second 112, 212 amplifier chains, and bias voltages being used for biasing the amplifiers in the first and second amplifier chain, while keeping a total gain k for the amplifier circuit 100, 200 essentially constant. The total gain k being provided by the amplifier circuit 100, 200 is here set and maintained by a closed loop coupling such that gain variations being generated by changes of one or more of the peaking amplifier gain $V_g$, the peaking amplifier $V_p$, or the bias voltages $B_{ca}$ and $B_{pk}$ for the first 211 and second 212 amplifier chains are compensated for by changes of the total gain adjustment $V_a$. This compensation by usage of the total gain adjustment $V_a$ is set to a converging time being considerably longer than a converging time for the predistortion signal $X_p$. Thus, the total gain k of the amplifier circuit 100, 200 is maintained essentially constant, while the working point $WP_{suitable}$ parameters are chosen in order to optimize the amplifier circuit 100, 200 regarding e.g. power consumption and/or linearity. Often a compromise between power consumption/efficiency and linearity has to be made when optimizing the working point $WP_{suitable}$ parameters.

According to an embodiment of the present invention, the working point unit 130, 230 is arranged for determining the suitable working point $WP_{suitable}$ such that an optimal efficiency and/or linearity is achieved for the output signal $X_O$.

The amplifying stage 110, 210 can, as is described above, include a number of different classes of amplifiers. When the amplifying stage 110, 210 includes a class AB amplifier, the suitable working point $WP_{suitable}$ being determined and adjusted by the present invention is an amplifier bias voltage defining a sweet point for the class AB amplifier.

According to an embodiment of the present invention, the working point unit 130, 230 is arranged for determining the suitable working point $WP_{suitable}$ by use of an iterative algorithm. There are a number of such iterative algorithms that could be used for this suitable working point $WP_{suitable}$ determination. For example, the iterative algorithm used can be a gradient descent algorithm, a steepest gradient descent algorithm, a conjugate gradient descent algorithm, a Newton-Raphson algorithm, or a secant variable metric algorithm. Also, essentially any other suitable iterative equation solution finding algorithm could be utilized for this determination.

According to an embodiment of the present invention, parameter values corresponding to a number of suitable working points $WP_{suitable}$ have been calculated and stored in a Look Up Table (LUT). Thus, the working point unit 130, 230 is then arranged for determining the suitable working point $WP_{suitable}$ by use of this Look Up Table.

According to an embodiment of the present invention, the working point unit 130, 230 is arranged for determining the suitable working point $WP_{suitable}$ by a combination of use of an iterative algorithm and use of a Look Up Table. For example, a coarse determination can first be made by use of the Look Up Table and then a finer determination can be made starting from the parameter values from the Look Up Table and then adjusted by use of the iterative algorithm.

According to an embodiment of the present invention, the working point unit 130, 230 is arranged for dynamically determining suitable working point $WP_{suitable}$ based on aging of at least one component of the amplifier circuit 100, 200 and/or on a current working condition for the amplifier circuit 100, 200.

The current working condition can here include an amplifier circuit temperature, a frequency of the input signal $X_{in}$, a number of carriers to be amplified, a power consumption for the amplifying stage, or an average output power for the amplifier circuit. As is understood by a skilled person, also other parameters can be included in the working condition parameters.

Figure 5:
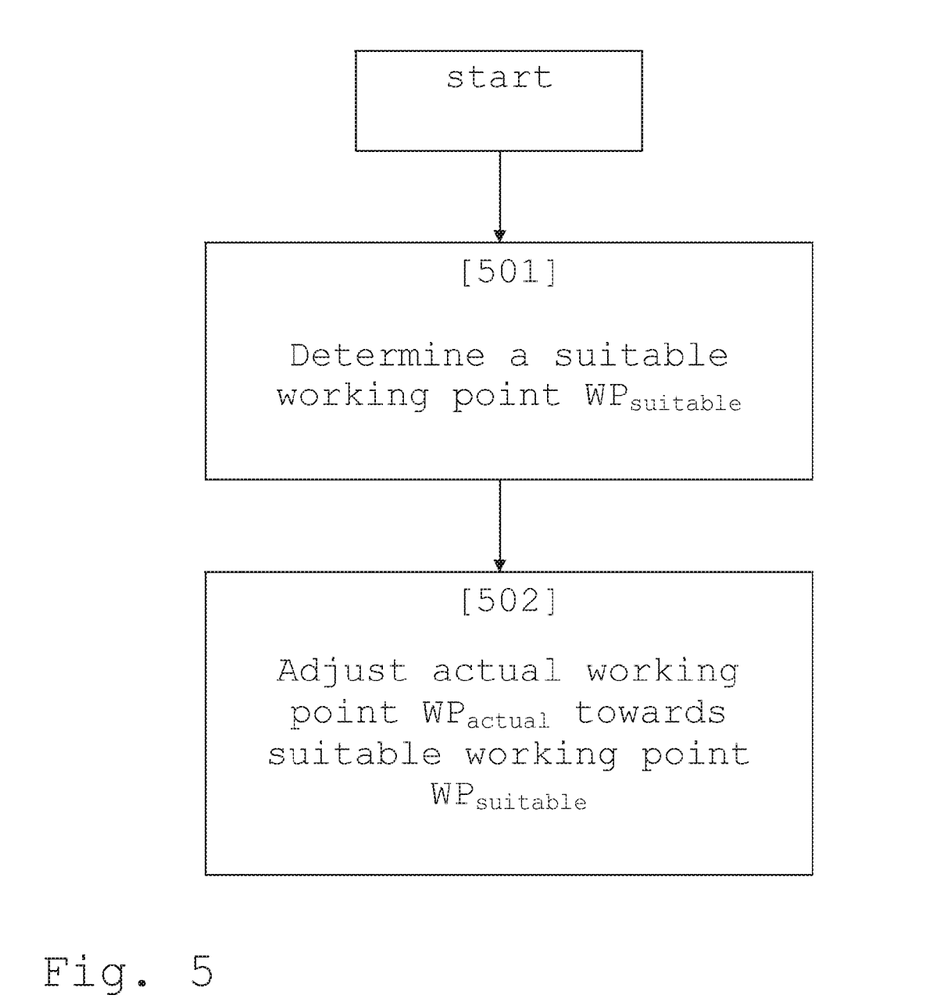
FIG. 5 shows a flow chart diagram of a method according to an embodiment of the present invention.

According to an aspect of the present invention, a method for the above described amplifier circuit is presented. FIG. 5 shows a flow chart diagram for the method. The amplifier circuit includes the amplifying stage 110, 210 and the predistortion stage 120, 220, and outputs an output signal $X_0$. The predistortion stage 120, 220 provides a predistortion signal $X_p$ to be added to the input signal $X_{in}$ of the amplifier circuit in order to compensate for non-linearites of the amplifying stage 110, 210.

In a first step 501 of the method according to the present invention, a determination of a suitable working point $WP_{suitable}$ to be used for the amplifying stage 110, 210 is performed based on the predistortion signal $X_p$.

In a second step 502 of the method, the actual working point $WP_{actual}$ being used by amplifying stage is adjusted towards the determined suitable working point $WP_{suitable}$.

As described above, the adjustment of the actual working point $WP_{actual}$ includes an adjustment of one or more of a phase difference $\Delta_{phase}$ between the first 111, 211 and second 112, 212 amplifier chains, an amplitude difference $\Delta_{amplitude}$ between the first 111, 211 and second 112, 212 amplifier chains, a bias voltage for the first 111, 211 amplifier chain, and a bias voltage for the second 112, 212 amplifier chain.

The working point unit 130, 230 can according to an embodiment determine the suitable working point $WP_{suitable}$ while keeping a total gain k for the amplifier circuit essentially constant.

According to an embodiment of the invention, the working point unit 130, 230 determines the suitable working point $WP_{suitable}$ such that the first signal S1 and the second signal S2 are in phase when being combined to the output signal $X_0$.

The working point unit 130, 230, can utilize iterative algorithms and/or Look Up Tables when determining the suitable working point $WP_{suitable}$. Such iterative algorithms may include e.g. a gradient descent algorithm, a steepest gradient descent algorithm, a conjugate gradient descent algorithm, a Newton-Raphson algorithm, and a secant variable metric algorithm.

According to an embodiment of the invention, the working point unit (130) dynamically determines the suitable working point $WP_{suitable}$ based on aging of at least one component of the amplifier circuit 100, 200 and/or on a current working condition for the amplifier circuit 100, 200. The current working condition may here include one or more of an amplifier circuit temperature, a frequency of said input signal $X_{in}$, a number of carriers to be amplified, a power consumption for said amplifying stage, and an average output power for said amplifier circuit.

The adjustment of the actual working point $WP_{actual}$ of the amplifying stages 110 and 210 illustrated in FIGS. 1-4 may for example include adjustment of one or more gate-source voltages, VGS. For example, one or more of the amplifying chains 111, 112, 211 and 212 may comprise one or more transistors (e.g. field-effect transistors) and the adjustment of the actual working point $WP_{actual}$ of the respective amplifying stage 110 or 210 may for example include adjustment of one or more gate-source voltages for the one or more transistors. In other words, the bias voltages $B_{ca}$ and $B_{pk}$ for the first and second amplifier chains 211 and 212 in the amplifying stage 210 described with reference to FIG. 4 may for example be gate-source voltages.

In the present example, one or more gate-source voltages may be employed to adjust the actual working point $WP_{actual}$ of the amplifying stage 210 (or 110) and there may be no need to adjust other voltages, such as drain-source voltages, VDS. The adjustment of the actual working point $WP_{actual}$ of the amplifying stage 210 (or 110) may for example include adjustment of gate-source voltages of transistors in the amplifying chains 211 and 212 (or 111 and 112), while keeping drain-source voltages of these transistors constant.

As described with reference to FIG. 4, the adjustment of the actual working point $WP_{actual}$ of the amplifying stage 210 may include adjustment, by the phase shifter 233, of a phase difference $\Delta_{phase}$ between the first 211 and the second 212 amplifier chains, and adjustment, by the second attenuator 232, of an amplitude difference $\Delta_{amplitude}$ between the first 211 and the second 212 amplifier chains. The phase difference $\Delta_{phase}$ and/or the amplitude difference $\Delta_{amplitude}$ may for example be independently controllable relative to the bias voltages (or gate-source voltages) of the first 211 and the second 212 amplifier chains. In other words, in addition to transistors for which bias voltages (or gate-source voltages) may be controlled based on the predistortion signal $X_p$, the amplifying stage 210 may comprise a second attenuator 232 and/or a phase shifter 233 adapted to provide separate control (based on the predistortion signal $X_p$) of the amplitude difference $\Delta_{amplitude}$ and/or the phase difference $\Delta_{phase}$ between the first 211 and the second 212 amplifier chains. Independent control of the phase difference $\Delta_{phase}$ and/or the amplitude difference $\Delta_{amplitude}$, relative to the bias voltages (or gate-source voltages), allows for a more efficient control of the actual working point $WP_{actual}$ of the amplifying stage 210 and may further increase efficiency of the amplifier circuit 200.

The phase difference $\Delta_{phase}$ and the amplitude difference $\Delta_{amplitude}$ may for example be independently controllable relative to each other (based on the predistortion signal $X_p$), e.g. via the phase shifter 233 and the second attenuator 232. Such independent control allows for a more efficient control of the actual working point $WP_{actual}$ of the amplifying stage 210 and may further increase efficiency of the amplifier circuit 200.

Those skilled in the art should understand that the foregoing embodiments may be implemented through programs instructing related hardware means and that the program can be stored on a computer readable storage media.

FIG. 6 schematically illustrates a very general radio communication system 600, in which the present invention may be implemented as an amplification circuit. The system 600 includes at least a first 610 and second 620 radio signal transmitting units communicating with each other over a radio interface 630.

Each of the first 610 and second 620 radio signal transmitting units includes hardware means 611, being a computer, a processor, a DSP (Digital Signal Processor), an ASIC (application Specific Integrated Circuit) or the like, being connected to an amplification and antenna circuits 613, 623 receiving and transmitting signals over the radio interface 630. The amplification and antenna circuits 613, 623 here thus include both antenna circuitry and amplification circuitry. The hardware means 611, 621 is, when being e.g. a processor, a DSP, a computer or the like, connected to a computer readable storage media 612, 622. The computer readable storage media 612 includes ROM/RAM, soft discs, Compact Disk, etc., and is arranged for providing the hardware means 611, 621 with instructions needed for performing the method of the invention, e.g. for performing the steps of determining a suitable working point $WP_{suitable}$ to be used for the amplifying stage 110, 210 based on the predistortion signal $X_p$, and of adjusting the actual working point $WP_{actual}$ towards the determined suitable working point $WP_{suitable}$.

The amplifier circuit 100, 200 according to the present invention can be included in a large number of radio signal transmitting devices, such as (but not limited to) an eNodeB, a User Equipment (UE), a Remote Unit (RU), a Remote Radio Head (RRH), a repeater, or a Distributed Antenna System (DAS).

Thus, the radio signal transmitting units 610, 620 in FIG. 6 can be any one of these devices.

The amplifier circuit 100, 200 and the method for an amplifier circuit according to the invention may be modified by those skilled in the art, as compared to the exemplary embodiments described above.

As is obvious for a skilled person, a number of other implementations, modifications, variations and/or additions can be made to the above described exemplary embodiments. It is to be understood that the invention includes all such other implementations, modifications, variations and/or additions which fall within the scope of the claims.

The invention claimed is:

1. An amplifier circuit including an amplifying stage and a predistortion stage, and being arranged for outputting an output signal ($X_o$), said predistortion stage being arranged for providing a predistortion signal ($X_p$) to be added to an input signal ($X_{in}$) of the amplifier circuit in order to compensate for non-linearites of said amplifying stage, the amplifier circuit comprising a working point unit, arranged for determining a suitable working point ($WP_{suitable}$) to be used for said amplifying stage based on said predistortion signal ($X_p$), and for adjusting an actual working point ($WP_{actual}$) being used by said amplifying stage towards said suitable working point ($WP_{suitable}$), wherein said amplifying stage includes a first and a second parallel amplifier chains, said first amplifier chain being arranged for amplification of higher and lower power signals, and said second amplifier chain being arranged for amplification only of higher power signals.

2. The amplifier circuit of claim 1, wherein said amplifying stage includes a Doherty configuration amplifier;
   wherein said adjustment of said actual working point ($WP_{actual}$) includes an adjustment of:
      a phase difference ($\Delta_{phase}$) between said first and second amplifier chains, and/or
      an amplitude difference ($\Delta_{amplitude}$) between said first and second amplifier chains.

3. The amplifier circuit of claim 1, wherein said adjustment of said actual working point ($WP_{actual}$) includes an adjustment of:
   a bias voltage for said first amplifier chain, and/or
   a bias voltage for said second amplifier chain.

4. The amplifier circuit of claim 3, wherein at least one of said bias voltage for said first amplifier chain and said bias voltage for said second amplifier chain is a gate-source voltage.

5. The amplifier circuit of claim 1, wherein said working point unit is arranged for determining said suitable working point ($WP_{suitable}$) while keeping a total gain (k) for said amplifier circuit essentially constant, the amplifier circuit comprising an attenuation unit adapted to provide attenuation compensating for gain variations caused by said adjustment of said actual working point ($WP_{actual}$).

6. The amplifier circuit of claim 1, wherein said working point unit is arranged for determining said suitable working point ($WP_{suitable}$) such that an optimal efficiency and/or linearity is achieved for said output signal ($X_o$).

7. The amplifier circuit of claim 1, wherein said working point unit is arranged for determining said suitable working point ($WP_{suitable}$) by use of an iterative algorithm.

8. The amplifier circuit of claim 7, wherein said working point unit is arranged for dynamically determining said suitable working point ($WP_{suitable}$) based on aging of at least one component of said amplifier circuit and/or on a current working condition for said amplifier circuit.

9. The amplifier circuit of claim 8, wherein said current working condition includes one or more parameters in the group of:
   an amplifier circuit temperature;
   a frequency of said input signal ($X_{in}$);
   a number of carriers to be amplified;
   a power consumption for said amplifying stage; and
   an average output power for said amplifier circuit.

10. The amplifier circuit of claim 1, wherein said working point unit is arranged for determining said suitable working point ($WP_{suitable}$) by use of a Look Up Table, LUT.

11. The amplifier circuit of claim 10, wherein said working point unit is arranged for dynamically determining said suitable working point ($WP_{suitable}$) based on aging of at least one component of said amplifier circuit and/or on a current working condition for said amplifier circuit.

12. The amplifier circuit of claim 11, wherein said current working condition includes one or more parameters in the group of:
   an amplifier circuit temperature;
   a frequency of said input signal ($X_{in}$);
   a number of carriers to be amplified;
   a power consumption for said amplifying stage; and
   an average output power for said amplifier circuit.

13. The amplifier circuit of claim 1, wherein said adjustment of said actual working point ($WP_{actual}$) includes adjustment of a gate-source voltage for said amplifying stage.

14. A method of using an amplifier circuit, said amplifier circuit including an amplifying stage and a predistortion stage, and outputting an output signal ($X_o$), said predistortion stage providing a predistortion signal ($X_p$) to be added to an input signal ($X_{in}$) of the amplifier circuit in order to compensate for non-linearites of said amplifying stage; the method comprising:
   determination of a suitable working point ($WP_{suitable}$) to be used for said amplifying stage based on said predistortion signal ($X_p$), and
   adjusting an actual working point ($WP_{actual}$) being used by said amplifying stage towards said suitable working point ($WP_{suitable}$),
   wherein said amplifying stage includes a first and a second parallel amplifier chains, said first amplifier chain amplifying higher and lower power signals, and said second amplifier chain amplifying only of higher power signals.

15. The method of claim 14, wherein said adjustment of said actual working point ($WP_{actual}$) includes an adjustment of:
   a phase difference ($\Delta_{phase}$) between said first and second amplifier chains, and/or
   an amplitude difference ($\Delta_{amplitude}$) between said first and second amplifier chains;
   wherein said adjustment of said actual working point ($WP_{actual}$) optionally includes adjustment of a gate-source voltage for said amplifying stage.

16. A non-transitory computer-readable storage medium storing executable code for amplification, the code when executed by a processor of an amplifier circuit, said amplifier circuit including an amplifying stage and a predistortion stage, and outputting an output signal (Xo), said predistortion stage providing a predistortion signal (Xp) to be added to an input signal (Xin) of the amplifier circuit in order to compensate for non-linearites of said amplifying stage; performs the actions comprising:
  determination of a suitable working point ($WP_{suitable}$) to be used for said amplifying stage based on said predistortion signal ($X_p$), and
  adjusting an actual working point ($WP_{actual}$) being used by said amplifying stage towards said suitable working point ($WP_{suitable}$),
  wherein said amplifying stage includes a first and a second parallel amplifier chains, said first amplifier chain amplifying higher and lower power signals, and said second amplifier chain amplifying only of higher power signals.

17. The non-transitory computer-readable storage medium of claim 16, wherein said adjustment of said actual working point ($WP_{actual}$) includes an adjustment of:
  a phase difference ($\Delta_{phase}$) between said first and second amplifier chains, and/or
  an amplitude difference ($\Delta_{amplitude}$) between said first and second amplifier chains;
  wherein said adjustment of said actual working point ($WP_{actual}$) optionally includes adjustment of a gate-source voltage for said amplifying stage.

* * * * *

UNITED STATES PATENT AND TRADEMARK OFFICE
CERTIFICATE OF CORRECTION

PATENT NO. : 9,948,245 B2
APPLICATION NO. : 14/915250
DATED : April 17, 2018
INVENTOR(S) : Daniel Kerek and Peter Lidberg Page 1 of 1

It is certified that error appears in the above-identified patent and that said Letters Patent is hereby corrected as shown below:

On the Title Page

Column 2, Line 6 Abstract, delete the word "non-linearites" and insert -- non-linearities --.

In the Specification

Column 4, Line 18, delete the word "non-linearites" and insert -- non-linearities --.

Column 4, Line 31, delete the word "non-linearites" and insert -- non-linearities --.

Column 11, Line 11, delete the word "non-linearites" and insert -- non-linearities --.

In the Claims

Column 13, Line 28, Claim 1, delete the word "non-linearites" and insert -- non-linearities --.

Column 14, Line 41, Claim 14, delete the word "non-linearites" and insert -- non-linearities --.

Column 15, Line 4, Claim 16, delete the word "non-linearites" and insert -- non-linearities --.

Signed and Sealed this
Twenty-second Day of October, 2019

Andrei Iancu
*Director of the United States Patent and Trademark Office*